United States Patent
Schmal et al.

(10) Patent No.: US 6,658,244 B2
(45) Date of Patent: Dec. 2, 2003

(54) METHOD AND CIRCUIT FOR COMPENSATION CONTROL OF OFFSET VOLTAGES IN A RADIO RECEIVING CIRCUIT INTEGRATED IN A CIRCUIT MODULE

(75) Inventors: Josef Schmal, München (DE); Timo Gossmann, Neubiberg (DE); Georg Lipperer, München (DE); Stefan Herzinger, München (DE)

(73) Assignee: Infineon Technologies AG, Munich (DE)

( * ) Notice: Subject to any disclaimer, the term of this patent is extended or adjusted under 35 U.S.C. 154(b) by 226 days.

(21) Appl. No.: 09/922,478

(22) Filed: Aug. 3, 2001

(65) Prior Publication Data

US 2002/0058489 A1 May 16, 2002

Related U.S. Application Data

(63) Continuation of application No. PCT/DE00/00264, filed on Feb. 1, 2000.

(30) Foreign Application Priority Data

Feb. 3, 1999 (DE) .......................................... 199 04 376

(51) Int. Cl.$^7$ ................................................ H04B 1/10
(52) U.S. Cl. ...................... 455/296; 455/298; 455/262; 375/319
(58) Field of Search .................................... 455/296, 298, 455/262, 198.1, 234.1, 234.2, 312; 375/317, 319

(56) References Cited

U.S. PATENT DOCUMENTS

| | | | | |
|---|---|---|---|---|
| 5,212,826 A | * | 5/1993 | Rabe et al. | .................. 455/214 |
| 5,475,710 A | * | 12/1995 | Ishizu et al. | ................. 375/232 |
| 5,539,779 A | * | 7/1996 | Nagahori | ..................... 375/317 |
| 5,697,085 A | * | 12/1997 | Birth et al. | .................. 455/296 |
| 5,724,653 A | * | 3/1998 | Baker et al. | .................. 455/296 |
| 5,867,777 A | * | 2/1999 | Yamaji et al. | ............ 455/234.1 |
| 6,324,389 B1 | * | 11/2001 | Vaisanen | ..................... 455/324 |

FOREIGN PATENT DOCUMENTS

| | | |
|---|---|---|
| DE | 30 41 417 C2 | 5/1986 |
| DE | 197 43 272 C1 | 2/1999 |
| EP | 0 594 894 A1 | 5/1994 |
| EP | 0 693 823 A1 | 1/1996 |

* cited by examiner

Primary Examiner—Edward F. Urban
Assistant Examiner—Simon Nguyen
(74) Attorney, Agent, or Firm—Laurence A. Greenberg; Werner H. Stemer; Ralph E. Locher

(57) ABSTRACT

Offset voltage compensation in baseband in a radio receiver path is achieved by control and programming signals which are required in any case to set the desired states in the circuit module. For this purpose a sequencer is started which is integrated on the module and provides additional control signals that are defined in time, without any additional computation power being required from a separate baseband processor. The offset voltage compensation can be used in receiver and transceiver chips for portable mobile radios, for example for GSM or PCN/PCS.

9 Claims, 4 Drawing Sheets

METHOD AND CIRCUIT FOR COMPENSATION CONTROL OF OFFSET VOLTAGES IN A RADIO RECEIVING CIRCUIT INTEGRATED IN A CIRCUIT MODULE

CROSS-REFERENCE TO RELATED APPLICATION

This application is a continuation of International Application No. PCT/DE00/00264, filed Feb. 1, 2000, which designated the United States.

BACKGROUND OF THE INVENTION

Field of the Invention

The invention relates to a method for compensation control of offset voltages in baseband in a radio receiving circuit integrated in a circuit module which operates using a time-division multiple access method (TDMA) with reception timeslots. A sampling operational amplifier taps off a baseband output signal and an output of the sampling operation amplifier charges and discharges an externally fitted capacitor in dependence on a polarity of an offset voltage via a sampling switch of a sample and hold circuit. The sampling switch is switched on by an offset compensation enable (OCE) control signal before each reception timeslot in order to carry out an offset compensation process. A differential amplifier is used for comparing a voltage applied to the capacitor internally with a reference voltage resulting in a compensation current for counteracting the offset voltage.

The invention also relates to a circuit for carrying out the method.

In an integrated radio receiver module or radio transceiver module, a received signal (wanted signal) that is applied to the antenna in the radio frequency band is converted to an intermediate frequency band (IF) in the reception path, and is then further converted to baseband (BB) by a demodulator (mixer).

Offset voltages resulting from production tolerances can now occur in the reception path. The amplifier that is located in the reception path amplifies the offset voltages to the same extent as the wanted signal. If, for example, there is an offset voltage of 20 mV at the input of an amplifier, then the offset voltage at the output of the amplifier is 126 mV. The high offset voltage leads to limiting of the desired signal, since the offset voltage reduces the drive range of the amplifier and of all the subsequent amplifiers in the reception path.

In all high-frequency circuit parts (RF and IF bands), the offset voltage can be eliminated at suitable points by capacitive coupling. In baseband, in which the signal frequencies are about 100 kHz, capacitive coupling is, however, no longer possible since very large capacitances would have to be used for capacitive coupling in the integrated circuit module. However, such large capacitances require very long charging times when the circuit module is switched on and occupy a considerable area on the chip, or cannot be produced at all on an integrated circuit module.

It is known from European Patent Application EP 0 693 823 for the offset voltages in baseband to be compensated for by a sample and hold circuit. A differential baseband signal, which is obtained from an IF signal via a demodulator operating at a local oscillator frequency, and is filtered out after a buffer amplifier by a baseband filter circuit, is tapped off internally at the baseband output, which is connected to a downstream baseband processor, and is supplied to a sampling operational amplifier.

Depending on the polarity of the offset voltage, the operational amplifier charges and discharges a capacitor, which is fitted externally via an output, via a controlled sampling switch in the sample and hold circuit. The capacitor voltage is supplied to a differential amplifier, where it is compared with a reference voltage. Compensation currents that counteract the offset voltage are produced at the output of the differential amplifier. The offset compensation process is carried out before each reception timeslot in the radio receiver, which is operated using time division multiple access (TDMA). To this end, the sampling switch in the known circuit is controlled via an offset compensation enable (OCE) control signal, which is external to the module.

The OCE control signal requires its own pin and must be provided by the baseband processor, which is located in a separate chip. To produce the control signal, additional complexity is required in the baseband processor, and additional computer power is required. Such compensation for the offset voltage in baseband is provided, for example, in the Siemens PMB 2405 receiver chip, for portable GSM mobile radios.

An offset compensation circuit for a PCM telecommunications system is described in German Patent DE 30 41 417 C2. The circuit may be in the form of a component on an integrated circuit. In this case, the aim is to avoid discrete external components. A bipolar voltage generator and an integration circuit with switchable capacitors are provided for offset compensation.

SUMMARY OF THE INVENTION

It is accordingly an object of the invention to provide a method and a circuit for compensation control of offset voltages in a radio receiving circuit integrated in a circuit module which overcomes the above-mentioned disadvantages of the prior art methods and devices of this general type, which make it possible for no specific pin to be required to carry out the offset voltage compensation in the radio receiver or transceiver chips, and which does not require any additional programming effort or extra computer power.

With the foregoing and other objects in view there is provided, in accordance with the invention, a method for compensation control of offset voltages in baseband in a radio receiving circuit integrated in a circuit module that operates using a time-division multiple access method (TDMA) with reception timeslots. The method includes using a sampling operational amplifier for tapping off a baseband output signal. An output of the sampling operation amplifier charges and discharges an externally fitted capacitor in dependence on a polarity of an offset voltage via a sampling switch of a sample and hold circuit. The sampling switch is switched on due to an offset compensation enable (OCE) control signal before each reception timeslot in order to carry out an offset compensation process. A differential amplifier compares a voltage applied to the capacitor internally with a reference voltage resulting in a compensation current for counteracting the offset voltage. The OCE control signal is supplied to the sampling switch within the circuit module and is generated in a sequencer functioning as a sequence controller provided in the circuit module. The sequencer is always started even before a start of an active TDMA reception timeslot and, for specific signals, emits a state sequence that is defined such that it is fixed in time, for a sequence control of the circuit module. The sequencer contains a running-down counter that, together with decoding logic at an output of the counter, emits the state sequence. The sequencer is started in dependence on three pulsed control signals which are input to the circuit module via a three-conductor bus and the sequencer starts when one of the three pulsed control signals has an edge, while the other two pulsed control signals are in a high state.

Thus, if a sequence controller, which is also referred to as a sequencer, is available on an integrated receiver or transceiver module, then, according to the invention, the process of offset voltage compensation can be carried out without any external OCE control signal having to be provided from the baseband processor.

A fully automatic offset voltage compensation sequence and the saving of a control pin on the integrated circuit module which contains the receiving circuit are thus achieved according to the invention in that control and programming signals, which are required in any case to set the desired states of the integrated circuit module are used to start the sequence controller (sequencer) which provides additional control signals, defined with respect to time, on the integrated circuit module (chip) without any additional computation power being required by the baseband processor contained in the radio.

The method and the circuit mentioned above for carrying out this method can be used particularly advantageously in a small transportable mobile radio (mobile telephone), which is used in a mobile radio system operating using time division multiple access, for example in a GSM or PCN/PCS mobile radio system.

In accordance with an added mode of the invention, there is the step of starting the sequencer using the three pulsed control signals when a programming of the circuit module ends, and one of the three pulsed control signals is an enable control signal available on the three-conductor bus.

In accordance with an additional mode of the invention, there is the step of starting the sequencer on one of a rising and falling edge of the enable control signal when the two other pulsed control signals are in a defined logic state.

In accordance with another mode of the invention, there are the steps of applying the OCE control signal to the sampling switch as a control signal to switch the sampling switch on for a fixed time period after the sequencer has started; and switching a state of the OCE control signal for turning off the sampling switch.

In accordance with a further mode of the invention, there is the step of setting a defined time period of an active state of the OCE control signal to be approximately 50 $\mu$s.

In accordance with another additional mode of the invention, there is the step of stopping the sequencer once the running-down counter has run down and then restarting the sequencer anew due to the influence of the three pulsed control signals.

In accordance with a concomitant mode of the invention, there is the step of setting the defined logic state to be a high logic state.

With the foregoing and other objects in view there is provided, in accordance with the invention, a circuit containing an integrated circuit module. The circuit module includes a sequencer with an output generating an offset compensation enable (OCE) control signal available at the output. A sampling switch having a control input is connected to the output of the sequencer and receives the OCE control signal. A three-conductor bus device is connected to the sequencer and receives three pulsed control signals passed on to the sequencer. The sequencer is configured such that the sequencer starts when one of the three pulsed control signals has an edge, while the other two of the three pulsed control signals are in a high state.

Other features which are considered as characteristic for the invention are set forth in the appended claims.

Although the invention is illustrated and described herein as embodied in a method and a circuit for compensation control of offset voltages in a radio receiving circuit integrated in a circuit module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
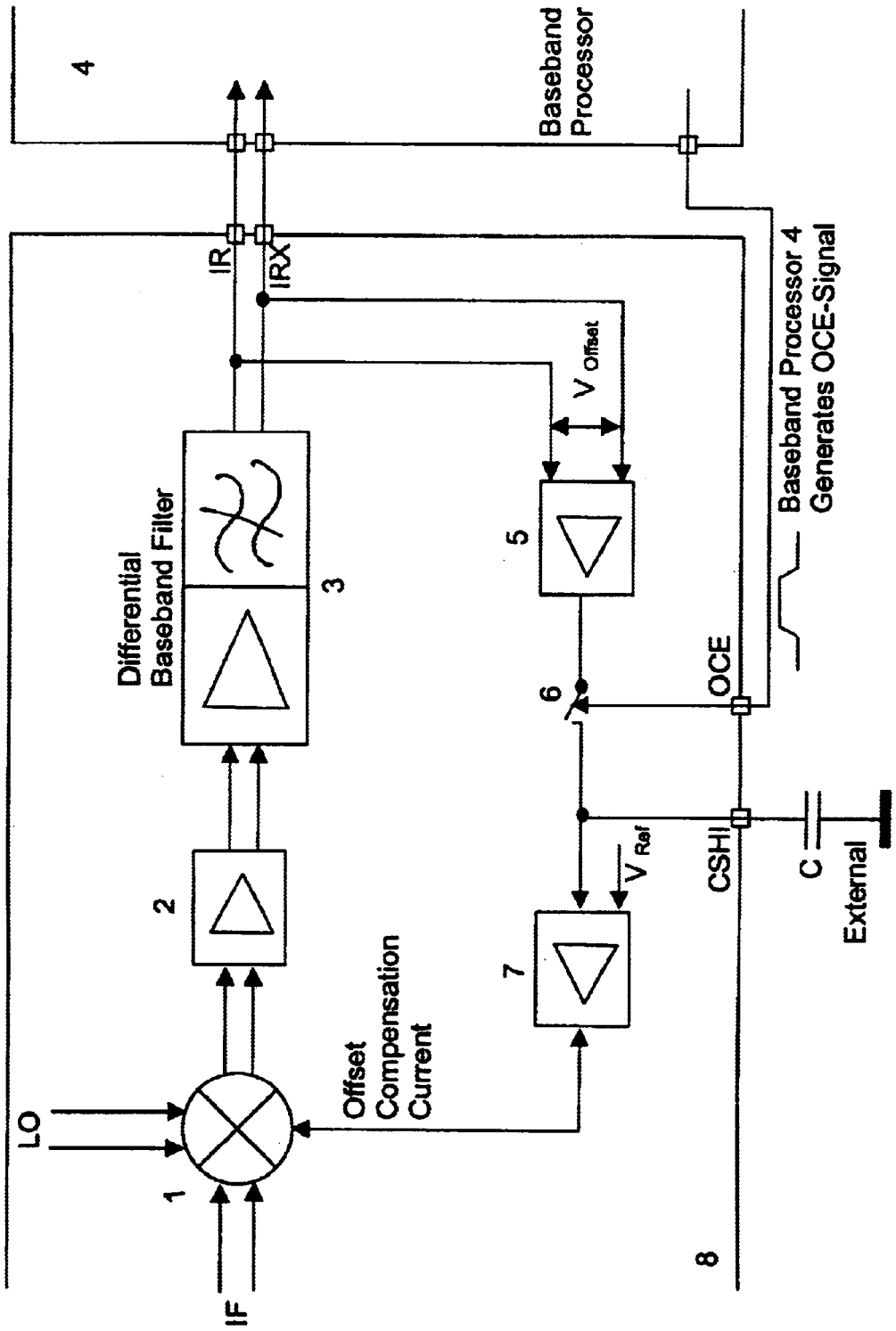
FIG. 1 is a block circuit diagram of a known integrated circuit with a sample and hold circuit for offset voltage compensation using an external OCE control signal.

In all the figures of the drawing, sub-features and integral parts that correspond to one another bear the same reference symbol in each case. Referring now to the figures of the drawing in detail and first, particularly, to FIG. 1 thereof, there is shown a differential baseband signal, which is obtained from an intermediate frequency signal IF via a demodulator 1 operating at a local oscillator frequency LO, and is filtered out after a buffer amplifier 2 by a baseband filter circuit 3. The differential baseband signal is tapped off internally at the baseband output IR, IRX, which is connected to a downstream baseband processor 4, and is supplied to a sampling operational amplifier 5.

Depending on a polarity of an offset voltage $V_{offset}$, the operational amplifier 5 charges and discharges a capacitor C, which is fitted externally via an output CSHI, via a controlled sampling switch 6 in the sample and hold circuit. A capacitor voltage is supplied to a differential amplifier 7, where it is compared with a reference voltage $V_{Ref}$. Compensation currents that counteract the offset voltage $V_{offset}$ are produced at an output of the differential amplifier 7. The offset compensation process is carried out before each reception timeslot in the radio receiver, which is operated using time division multiple access (TDMA). To this end, the sampling switch 6 in the known circuit is controlled via an offset compensation enable (OCE) control signal, which is external to the module.

The OCE control signal requires its own pin and must be provided by the baseband processor 4, which is located in a separate chip. To produce the OCE control signal, additional complexity is required in the baseband processor 4, and additional computer power is required.

Figure 2:
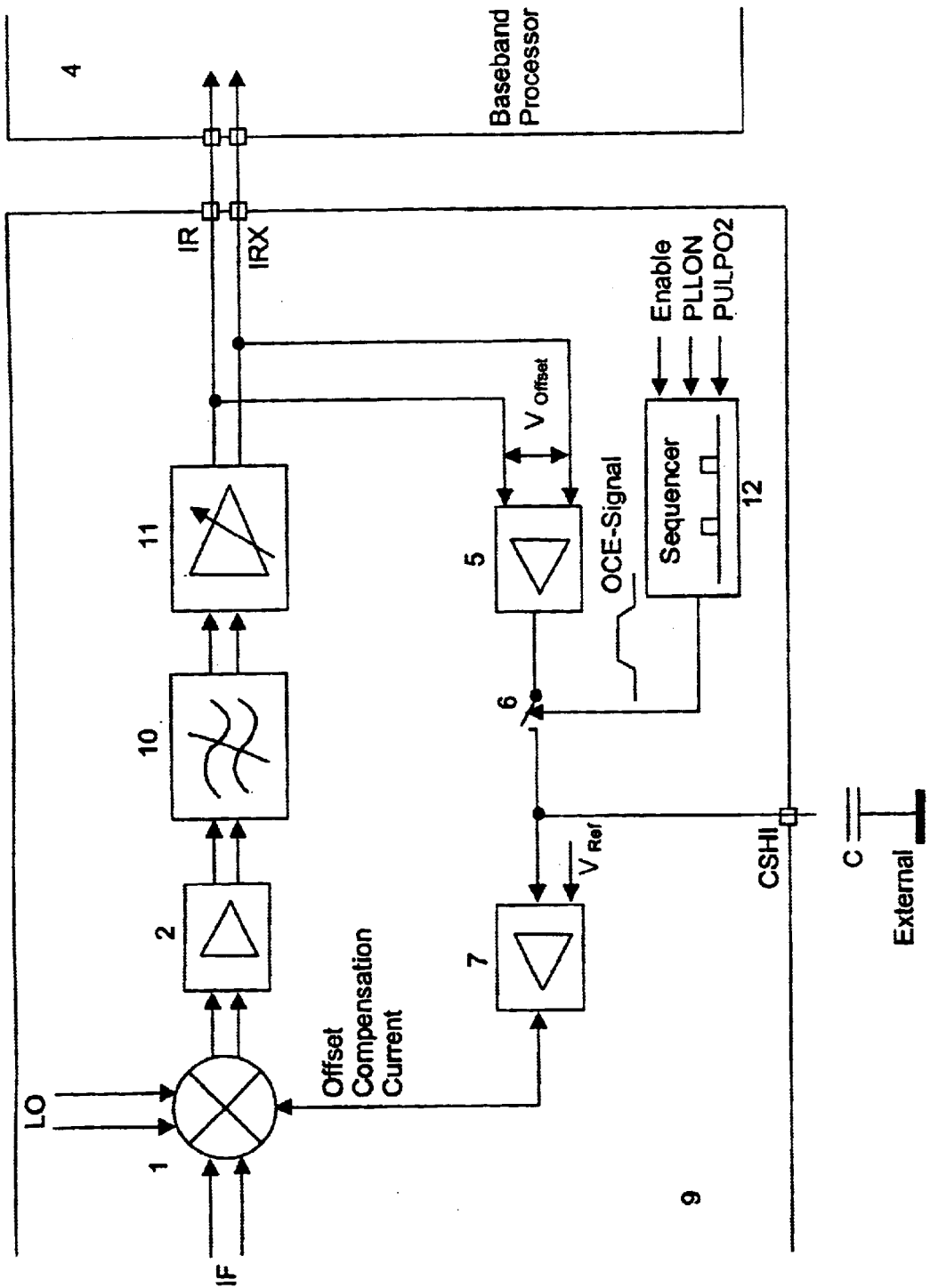
FIG. 2 is a block circuit diagram of an integrated circuit according to the invention, likewise having the sample and hold circuit, but in which the offset voltage compensation is carried out internally by the OCE control signal produced in a sequencer.

FIG. 2 shows an integrated receiver or transceiver circuit module 9. Offset voltages which are present in baseband are likewise compensated for using the sample and hold circuit.

As is shown in detail in FIG. 2, the differential baseband signal, which is obtained from the intermediate signal IF using the demodulator 1 fed with the local oscillator frequency LO, and is filtered out after the buffer amplifier 2 by a low-pass filter 10, is for this purpose tapped off internally, after passing through a baseband control amplifier 11, at the baseband output IR, IRX. The baseband output IR, IRX is connected to the downstream baseband processor 4, and the baseband signal is supplied to the sampling operational amplifier 5.

Depending on the polarity of the offset voltage $V_{Offset}$, the operational amplifier 5 charges or discharges the externally fitted capacitor C, which forms the hold element of the sample and hold circuit, via the controlled sampling switch 6 in the sample and hold circuit and via an output CSHI.

The capacitor voltage is supplied to the differential amplifier 7, where it is compared with the reference voltage $V_{Ref}$. The compensation currents that counteract the offset voltage $V_{offset}$ are produced at the output of the differential amplifier 7. A sequence controller 12 in the form of a sequencer 12 is provided on the integrated receiver or transceiver circuit module 9.

Thus, according to the invention, the process of offset voltage compensation can be carried out before each TDMA reception timeslot without an external control signal that, in the known circuit, must be provided by the baseband processor 4.

The required offset compensation enable (OCE) control signal for the sampling switch 6 is produced internally by the sequencer 12 in the integrated receiver or transceiver circuit module 9. An output, which emits the control signal OCE, of the sequencer 12 that is contained on the integrated circuit module 9 is for this purpose connected to the control input of the sampling switch 6, which is likewise contained on the circuit module 9.

The sequencer 12 is started even before the active reception timeslot (RX slot). The time sequence of the sequencer 12 is shown in detail in FIG. 3. In the exemplary embodiment, the sequencer 12 is started at the end of the programming of an integrated three-conductor bus that is used, per se, for actuating other functional elements and for carrying out other functions on the integrated circuit module 9.

Figure 3:
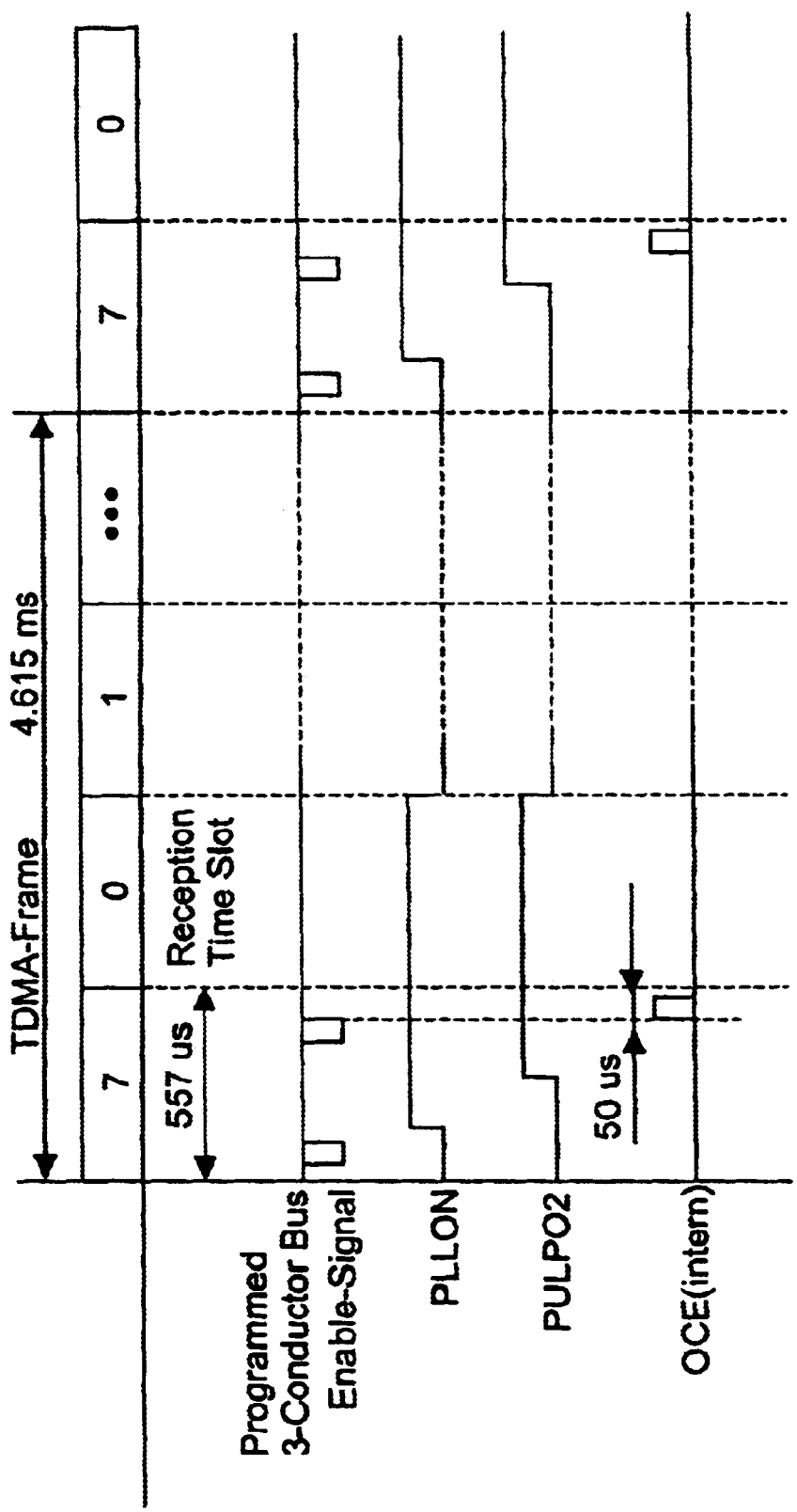
FIG. 3 is a timing diagram of the sequencer, which is provided in the circuit as shown in FIG. 2, for producing the OCE control signal.

In the exemplary embodiment, an enable control signal (three-conductor bus) and two control signals annotated PLLON and PUPLO2 are used to start the sequencer 12. As shown in FIG. 3, a rising edge of the enable control signal is used for starting, when the two control signals PLLON and PUPLO2 are in the HIGH state (=logic 1).

The sequencer 12, which is accommodated in integrated form on the circuit module 9, corresponds to a running-down counter which, together with decoder logic at the output, emits a state sequence (timing), which is defined such that it is fixed in time, at the output for specific signals, that is to say in this case for the control signal OCE. The pulsed control signal OCE is thus produced internally on the circuit module 9.

The offset voltage compensation thus takes place without any additional, external control and computation complexity from the baseband processor 4. In comparison to the known solutions, this saves a control pin on the circuit module 9, as well as computation power and programming complexity in the baseband processor 4.

In the embodiment illustrated in FIG. 2 for the method according to the invention, the sequencer 12 is thus triggered or started by the three pulsed control signals Enable (three-conductor bus), PLLON and PUPLO2. These signals are already present on the integrated circuit module 9, and are also required for other switching and adjustment processes.

Once the sequencer 12 has been started, then it sets the control signal OCE to HIGH level for a time period of approximately 50 µs, as can be seen from the timing diagram illustrated in FIG. 3, which applies to a TDMA frame (duration =4.615 ms) in the GSM mobile radio system. The sequencer 12 then once again sets the control signal OCE to the LOW level.

Once the counter function in the sequencer 12 has run down, the sequencer 12 stops and must be restarted from new by the three triggering control signals Enable, PLLON and PUPLO2. The pulsed control signal OCE that is produced within the module controls the sampling switch 6, and thus the offset voltage compensation process. There is no longer any need for a control signal which are produced externally and can thus be supplied on their own via a special pin on the circuit module 9.

Figure 4:
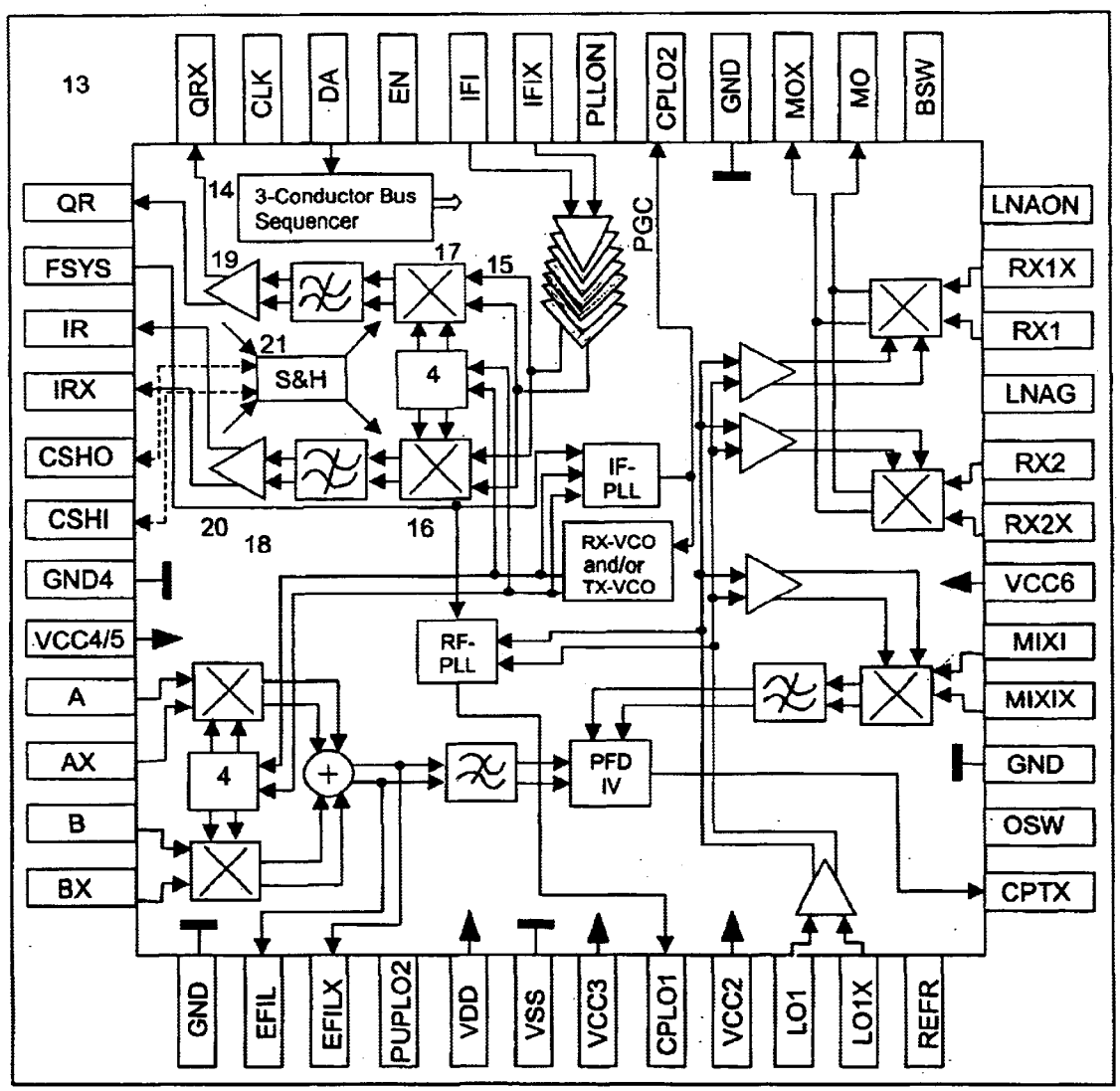
FIG. 4 is a block diagram of an integrated transceiver module with a circuit configured in which the method according to the invention is used.

FIG. 4 shows a block diagram of an overall transceiver circuit integrated in a circuit module 13, with a three-conductor bus and a sequencer 14. Those elements affected by the invention in the reception path part, which contain two differential signal paths (I path and Q path), such as two demodulator mixers 15 and 16, two low-pass filters 17 and 18, differential baseband control amplifiers 19 and 20 and a sample and hold circuit (S&H) 21, which interacts via pins CSHI and CSHQ with external capacitors (which are not shown in FIG. 4), are illustrated surrounded by bold lines.

As can be seen from FIG. 4, the integrated transceiver circuit module 13 does not have a specific pin for the OCE control signal for the sample and hold circuit 21, since the control signal is produced within the module, using the sequencer 14.

We claim:

1. A method for compensation control of offset voltages in baseband in a radio receiving circuit integrated in a circuit module that operates using a time-division multiple access method (TDMA) with reception timeslots, which comprises the steps of:

using a sampling operational amplifier for tapping off a baseband output signal, an output of the sampling operation amplifier charging and discharging an externally fitted capacitor in dependence on a polarity of an offset voltage via a sampling switch of a sample and hold circuit;

switching on the sampling switch using an offset compensation enable (OCE) control signal before each reception timeslot in order to carry out an offset compensation process;

using a differential amplifier for comparing a voltage applied to the capacitor internally with a reference voltage resulting in a compensation current for counteracting the offset voltage;

producing the OCE control signal supplied to the sampling switch within the circuit module using a sequencer functioning as a sequence controller provided in the circuit module, the sequencer is always started even before a start of an active TDMA reception timeslot and, for specific signals, emits a state sequence which is defined such that it is fixed in time, for a sequence control of the circuit module, the sequencer contains a running-down counter which, together with decoding logic at an output of the counter, emits the state sequence; and starting the sequencer in dependence on three pulsed control signals which are input to the circuit module via a three-conductor bus and the sequencer starts when one of the three pulsed control signals has an edge, while the other two pulsed control signals are in a high state.

2. The method according to claim 1, which comprises starting the sequencer using the three pulsed control signals when a programming of the circuit module ends, and one of the three pulsed control signals is an enable control signal available on the three-conductor bus.

3. The method according to claim 2, which comprises starting the sequencer on one of a rising and falling edge of the enable control signal when the two other pulsed control signals are in a defined logic state.

4. The method according to claim 3, which comprises setting the defined logic state to be a high logic state.

5. The method according to claim 2, which comprises stopping the sequencer once the running-down counter has run down and then restarting the sequencer anew due to the influence of the three pulsed control signals.

6. The method according to claim 1, which comprises:

applying the OCE control signal to the sampling switch as a control signal to switch the sampling switch on for a fixed time period after the sequencer has started; and switching a state of the OCE control signal for turning off the sampling switch.

7. The method according to claim 6, which comprises setting a defined time period of an active state of the OCE control signal to be approximately 50 µs.

8. A circuit, comprising:

an integrated circuit module, including:
    a sequencer with an output generating an offset compensation enable (OCE) control signal available at said output;
    a sampling switch having a control input connected to said output of said sequencer and receiving the OCE control signal; and
    a three-conductor bus device connected to said sequencer and receiving three pulsed control signals passed on to said sequencer, said sequencer configured such that said sequencer starts when one of the three pulsed control signals has an edge, while the other two of the three pulsed control signals are in a high state.

9. A transportable mobile radio for use in a mobile radio system which operates using time division multiple access (TDMA), comprising:

an integrated circuit module, including:
    a sequencer with an output generating an offset compensation enable (OCE) control signal available at said output;
    a sampling switch having a control input connected to said output of said sequencer and receiving the OCE control signal; and
    a three-conductor bus device connected to said sequencer and receiving three pulsed control signals passed on to said sequencer, said sequencer configured such that said sequencer starts when one of the three pulsed control signals has an edge, while the other two of the three pulsed control signals are in a high state.

* * * * *